United States Patent
Ghosh et al.

(10) Patent No.: US 8,564,187 B2
(45) Date of Patent: Oct. 22, 2013

(54) COLOR ORGANIC LIGHT-EMITTING DIODE DISPLAY DEVICE

(75) Inventors: Amalkumar P. Ghosh, Hopewell Junction, NY (US); Ronald W. Wake, Newburgh, NY (US)

(73) Assignee: Emagin Corporation, Hopewell Junction, NY (US)

( * ) Notice: Subject to any disclaimer, the term of this patent is extended or adjusted under 35 U.S.C. 154(b) by 0 days.

(21) Appl. No.: 13/524,344

(22) Filed: Jun. 15, 2012

(65) Prior Publication Data

US 2012/0319564 A1 Dec. 20, 2012

Related U.S. Application Data

(60) Provisional application No. 61/498,690, filed on Jun. 20, 2011.

(51) Int. Cl.
*H01J 1/62* (2006.01)

(52) U.S. Cl.
USPC .......................................... 313/501; 313/506

(58) Field of Classification Search
USPC .................. 313/498, 500, 501, 504, 506, 512
See application file for complete search history.

(56) References Cited

U.S. PATENT DOCUMENTS

| | | | | |
|---|---|---|---|---|
| 6,608,439 B1 * | 8/2003 | Sokolik et al. | ................. | 313/512 |
| 8,044,577 B2 * | 10/2011 | Hwang et al. | ................. | 313/506 |

\* cited by examiner

*Primary Examiner* — Vip Patel
(74) *Attorney, Agent, or Firm* — Epstein Drangel LLP; Robert L. Epstein

(57) ABSTRACT

A color display device that increases the efficiency of use of white light emitted from an organic light-emitting diode (OLED) in producing an improved color display. The device includes a plurality of color OLED display pixels, which include an OLED, a color filter layer, and a color conversion matrix sandwiched between the OLED and the color filter layer. The color filter layer has a plurality of color filter elements including a red, green and blue color filter element. The array of subpixels comprised in the color conversion matrix is composed of semiconductor nanocrystals uniformly dispersed in an organic binding material, which may be employed in either down-emitting or up-emitting color OLED display devices.

28 Claims, 3 Drawing Sheets

COLOR ORGANIC LIGHT-EMITTING DIODE DISPLAY DEVICE

CROSS-REFERENCE TO RELATED APPLICATION

This application claims the benefit of provisional patent application Ser. No. 61/498,690 filed in the United States Patent and Trademark Office on Jun. 20, 2011.

BACKGROUND OF THE INVENTION

1. Field of the Invention

This invention relates generally to color organic light-emitting diode (OLED) displays, and more particularly, to improving the efficiency of use of white light emitted from the diode in producing a color display by incorporating a color conversion layer between the white light emitting diode and the color filter layer. The color conversion layer consists of nanocrystals, which are dispersed in a transparent binding material and may be employed in either down-emitting or up-emitting color OLED display devices.

2. Description of the Related Art

A light-emitting diode (LED) is a form of solid-state light source having a structure of a p-n junction. In an OLED, one or more layers of semiconducting organic material are sandwiched between two electrodes. An electric current is applied to the device, causing negatively charged electrons to move into the organic material(s) from the cathode. Positive charges, typically referred to as holes, move in from the anode. The positive and negative charges meet in the center layers (i.e. organic material), recombine, and produce photons. The wavelength of the photons, and consequently the color of the emitted light, depends on the electronic properties of the organic material in which the photons are generated.

The color of light emitted from the OLED display device can be controlled by the choice of the organic material. The color of light emitted by a particular structure can be controlled both by selection of the organic material as well as by selection of luminescent impurities, or dopants, added to the organic materials.

The color of the light emitted from the OLED display device can also be affected by color conversion layers and color filters placed in the path of the emitted light.

A color display requires the ability to provide a wide gamut of colors. In displays, this is accomplished by mixing various amounts of the primary colors: red, green, and blue in each of the individual picture elements, pixels. Thus, each pixel consists of subpixels, which define the color characteristics of the primaries used to compose the desired color. The amount of each primary color needed is dependent on both the distribution of wavelengths emitted by the OLED and the color-altering characteristics of the individual subpixels.

The color definition of the subpixels can be accomplished by one of two basic techniques. One approach provides a self-emissive pixelated display with red, green, and blue (RGB) subpixels placed next to each other. This approach, in principle, allows the best possible performance because no light is lost through filter absorption or color conversion. It requires, however, precise shadow mask fabrication and alignment in the process of vacuum deposition of the organic material(s). Such precision has become increasingly difficult as the resolution desired for the display increases. The second approach involves depositing the necessary organic materials to yield a white light emission from the OLED. This white light is selectively converted to the desired color by the use of a color filter patterned over the array of subpixels. The patterning of the color filter materials is readily accomplished with standard lithographic techniques. The major drawback of this approach is that much of the OLED emission is lost in the color filtering process.

A recent variation on the latter technique is disclosed in U.S. Pat. No. 6,608,439 to Sokolik et al., which limits the emission of the OLED to relatively short, high-energy wavelengths in the blue or near ultraviolet region of the electromagnetic spectrum. This high-energy emission is then down converted to less energetic green and red by color conversion. If a blue emission is used, then either no conversion or only minor filtering is necessary for the blue component. This color conversion can be accomplished either by use of organic materials which absorb the high-energy emission and photoluminance or by inorganic nanocrystals. The organic materials have the characteristic of broad luminescent spectra, which results in the need for further color filtration and loss of emission. The inorganic nanocrystals have recently gained favor because of their narrow emission bands and the ability to tune the wavelength characteristics by controlling the size of the particles.

Although this high-energy variation is attractive in principle, presently, the availability of the necessary materials is lacking. Present materials do not have enough emission intensity and lifetime to make a display that is commercially competitive. As such, while this prior art may be suitable for the particular purpose employed, or for general use, it would not be as suitable for the purposes of the present invention as disclosed hereafter.

The present invention improves on the prior art by taking existing white light emitting OLED display devices and increasing the efficiency with which they convert the light into the needed colors.

It is, therefore, a primary object of the present invention to increase the efficiency of use of white light emitted from a diode by incorporating a color conversion layer between the white light emitting diode and the color filter layer.

It is another object of the present invention to provide a color conversion layer that may be employed in either down-emitting or up-emitting color OLED display devices.

It is another object of the present invention to provide an increase in the red and green color emission output from a white light-emitting diode.

It is another object of the present invention to provide a display device with improved luminance.

BRIEF SUMMARY OF THE INVENTION

In accordance with one aspect of the present invention, a color OLED display pixel is provided that comprises an OLED, a color filter layer, and a color conversion matrix sandwiched between the OLED and the color filter layer for converting white light emitted from said OLED to color.

In accordance with an additional embodiment, a color OLED display pixel is provided that comprises an OLED, a color filter layer, and a means for converting white light emitted from the OLED to color. In this embodiment, the color conversion means comprises an array of subpixels arranged adjacent the color filter layer. It is preferable that the color conversion means is sandwiched between the OLED and the color filter layer.

In one example, a transparent substrate is arranged adjacent the color filter layer, such that the OLED emits white light downwardly. In an alternate example, an opaque substrate is arranged adjacent the OLED, such that the OLED emits white light upwardly.

Herein, the color filter layer comprises a plurality of color filter elements including a red, green and blue color filter element. The array of subpixels of the color conversion means include at least one red subpixel aligned with the first red color filter element, at least one green subpixel aligned with the green color filter element and at least one blue subpixel aligned with the blue color filter element.

It is preferred that the array of subpixels of the color conversion means are composed of semiconductor nanocrystals uniformly dispersed in an organic binding material. Preferably, the subpixels of the color conversion means have at least one red semiconductor nanocrystal within the red subpixel and at least one green semiconductor nanocrystal within the green subpixel.

It is contemplated that each subpixel of the color conversion means is either of uniform size, or the blue subpixel is greater in size than the red and green subpixels, or the green subpixel is greater in size than the red and blue subpixels, or the blue and green subpixels are greater in size than the red subpixels.

The nanocrystals may be formed from cadmium and either sulfur, selenium or tellurium. The organic binding material may be polycarbonate or polyacrylate. The organic binding material may consist of a polymer, oligomer, monomer, or a mixture of polymer, oligomer or monomer.

In accordance with an additional embodiment, an organic light-emitting diode video display for emitting light downwardly is presented, which includes a plurality of pixel elements. Each pixel element comprises a flat transparent substrate and a color filter layer arranged on the flat transparent substrate, which has at least three color filter elements disposed therein. The pixel element further includes a color conversion matrix arranged on the color filter layer which has a plurality of subpixels disposed therein. A two-dimensional matrix layer of organic light-emitting diodes is arranged on the color conversion matrix.

The preferred two-dimensional matrix layer includes a semitransparent electrode, at least one organic layer arranged on the semitransparent electrode and a reflecting electrode arranged on the organic layer.

The color filter elements include a red, green and blue color filter element. The subpixels of the color conversion matrix are composed of semiconductor nanocrystals uniformly dispersed in an organic binding material.

Preferably, the nanocrystals are formed from cadmium and either sulfur, selenium or tellurium. The organic binding material may be polycarbonate or polyacrylate. The organic binding material may consist of a polymer, oligomer, monomer, or a mixture of polymer, oligomer or monomer.

In accordance with an additional embodiment, an organic light-emitting diode video display for emitting light upwardly is presented, which includes a plurality of pixel elements. Each pixel element comprises a flat opaque substrate, a reflecting electrode arranged on the substrate and a two-dimensional matrix layer of organic light-emitting diodes arranged on the reflecting electrode. The two-dimensional matrix layer preferably includes at least one organic layer arranged on the reflecting electrode and a semitransparent electrode arranged on the organic layer.

The pixel element further includes a color conversion matrix arranged on the two-dimensional matrix layer, wherein the color conversion matrix includes a plurality of subpixels disposed thereon. A color filter layer is arranged on the color conversion matrix and has at least three color filter elements disposed thereon. Preferably, the color filter elements include a red, green and blue color filter element.

The subpixels of the color conversion matrix are composed of semiconductor nanocrystals uniformly dispersed in an organic binding material. The nanocrystals may be formed from cadmium and either sulfur, selenium or tellurium. The organic binding material may be polycarbonate or polyacrylate. The organic binding material may consist of a polymer, oligomer, monomer, or a mixture of polymer, oligomer or monomer.

In accordance with an additional embodiment, a method for improving the efficiency of use of white light emitted from a diode in the pixel of an OLED color display is provided. In particular, the OLED color display is of the type having a color filter layer that incorporates a color conversion matrix between the white light emitting diode and the color filter layer.

In one example of this embodiment, white light is emitted downwardly from the diode by including a transparent substrate arranged adjacent the color filter layer.

In an alternate example of this embodiment, white light is emitted upwardly from the diode by including an opaque substrate arranged adjacent the white light emitting diode.

BRIEF DESCRIPTION OF THE SEVERAL
VIEWS OF THE DRAWINGS

To these and to such other objects that may hereinafter appear, the present invention relates to an improved efficiency color OLED display device having a color conversion layer between the white light emitting diode and the color filter layer as described in detail in the following specification and recited in the annexed claims, taken together with the accompanying drawings, in which like numerals refer to like parts in which:

Figure 3:
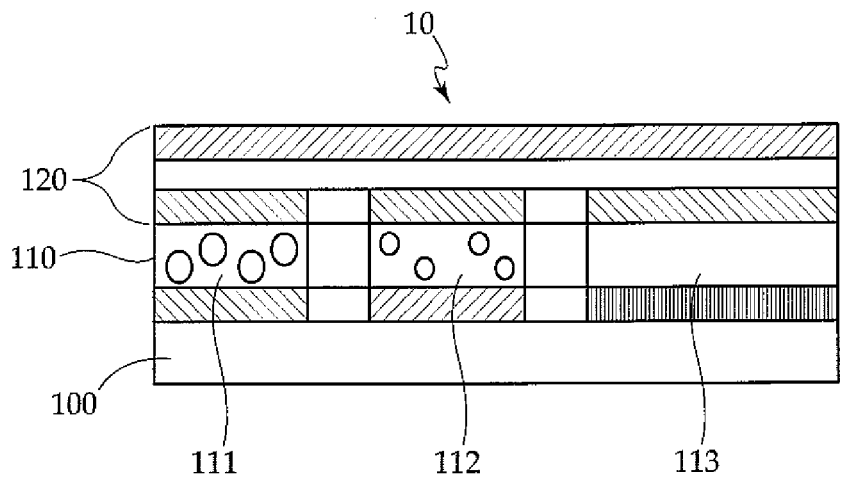
Figure 4:
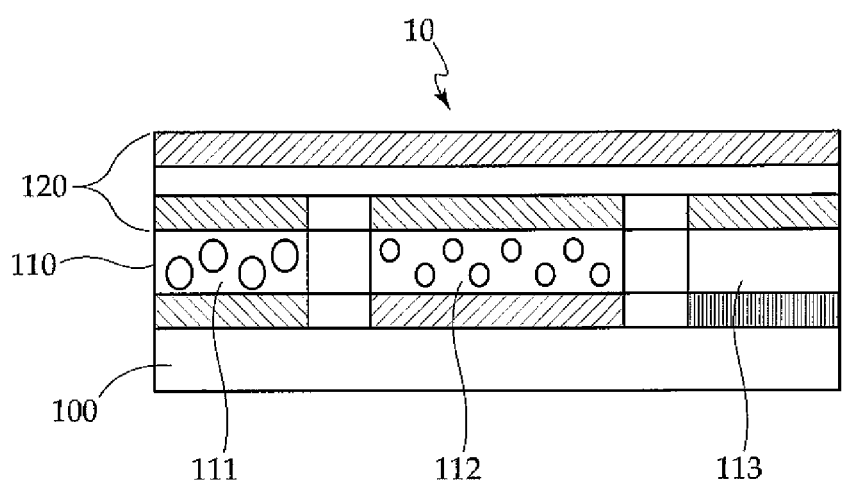

FIG. 3 is a schematic diagram of an alternate embodiment single pixel element for a down-emitting color organic light-emitting diode display device of the present invention, wherein a blue subpixel area of a color conversion means is greater in size than a red and green subpixel area; and FIG. 4 is a schematic diagram of an alternate embodiment single pixel element for a down-emitting color organic light-emitting diode display device of the present invention, wherein a green subpixel area of a color conversion means is greater in size than a red and blue subpixel area.

Figure 5:
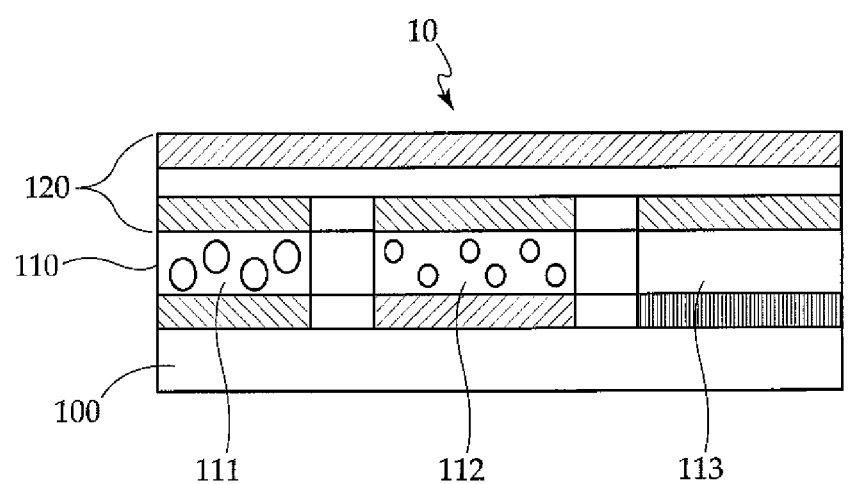

FIG. 5 is a schematic diagram of an alternate embodiment single pixel element for a down-emitting color organic light-emitting diode display device of the present invention, wherein a blue subpixel and a green subpixel area of a color conversion means is greater in size than a red subpixel area.

To the accomplishment of the above and related objects the invention may be embodied in the form illustrated in the accompanying drawings. Attention is called to the fact, however, that the drawings are illustrative only. Variations are contemplated as being part of the invention, limited only by the scope of the claims.

DETAILED DESCRIPTION OF THE INVENTION

The present invention is directed to an improved color display device that increases the efficiency of use of white light emitted from a diode by incorporating a color conversion layer. The color conversion layer may be employed in either down-emitting or up-emitting color OLED display devices.

Figure 1:
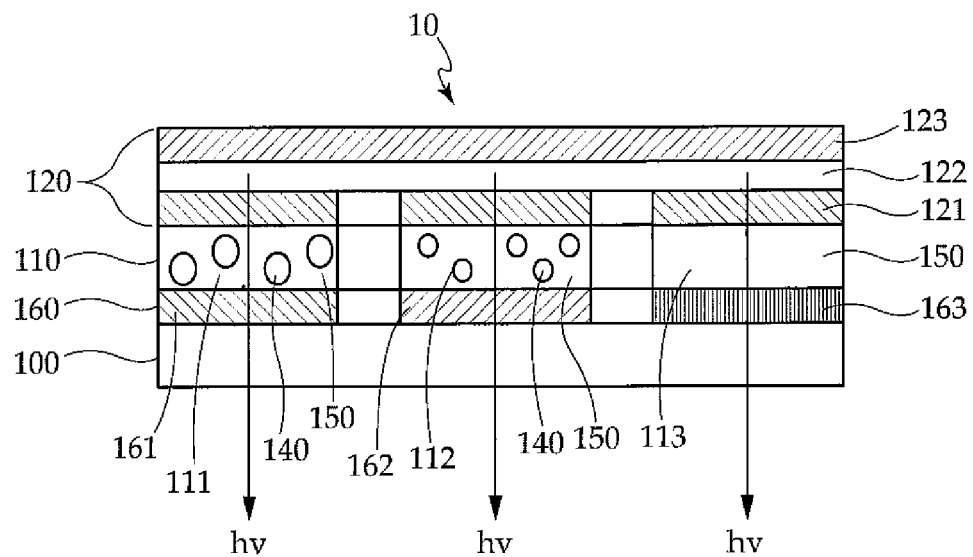
FIG. 1 is a schematic diagram of a single pixel element for a down-emitting color organic light-emitting diode display device of the present invention.

FIG. 1 illustrates a single pixel element 10 for a down-emitting color OLED display device. In this embodiment, pixel element 10 comprises a flat substrate 100 and a color filter layer 160. The color filter layer 160 consists of at least three color filter elements, including a first color filter element 161, a second color filter element 162, and a third color filter element 163 disposed therein. A color conversion matrix 110 consisting of at least three subpixels, including a first subpixel 111, a second subpixel 112, and a third subpixel 113 is further disposed therein. The substrate 100 is preferably transparent with this down-emitting embodiment.

In this embodiment, an addressable two-dimensional matrix of organic light-emitting diodes (OLEDs) 120 is formed, which emits many wavelengths across the visible spectrum and is in contact with color conversion matrix 110. The matrix of OLEDs 120 consists of a semitransparent electrode 121, at least one organic layer 122, and a reflecting electrode 123. The light output from the OLED 120 would be considered white if viewed directly.

As embodied herein, the color conversion matrix 110 comprises a two-dimensional array of three subpixels for color conversion. The first subpixel 111 emits red light both from the original red output of the OLED and also from the blue and green light emitted from the OLED 120 that first subpixel 111 converts to red light. The first color filter element 161 is a red color filter element. The red color filter element 161 is only necessary if tuning of the spectral properties of the red emission of the first subpixel 111 is desired. Likewise, second subpixel 112 emits green light both from the original green light produced by the OLED 120 and blue light emitted from the OLED 120 that second subpixel 112 converts to green. The second color filter element 162 is a green light filter element. The green light filter element 162 is necessary to filter out any red light emitting from the OLED 120 output since that component cannot be converted to higher energy green light by the green color conversion element 112. In this manner, the red and green emissions from the pixel element 10 are increased from what they would have been by simply filtering the white light output of OLED 120.

The third subpixel 113 emits only the blue light produced by the OLED 120 directly. The third color filter element 163 is a blue light filter element. The blue light filter element 163 is necessary to remove the green and red components of the OLED 120 emission.

In this embodiment, the first and second color conversion subpixels 111 and 112 respectively, may be composed of semiconductor nanocrystals 140 uniformly dispersed in a suitable organic binding material 150. Preferably, nanocrystals 140 may be formed from "Cdx," where "Cd" is cadmium, and "x" may be chosen from sulfur, selenium, or tellurium.

Preferably, the organic binding material 150 may be polycarbonate, polyacrylate, or another like polymer, oligomer, monomer, or a mixture of these. Each pixel element 10 of the integrated display device comprises at least one color converting semiconducting nanocrystals sub-element 140 within the one first red subpixel 111 and the one second green subpixel 112, capable of absorbing shorter wavelengths and converting them into red and green light, respectively. The third blue subpixel 113 within each pixel element 10 contains pure organic binder material 150 and no nanocrystals, since blue light is the highest energy component of the white OLED 120 emission.

As shown in FIG. 1, the pixel element 10 contains one of each of the primary colors, red, green and blue. Also, each subpixel is indicated to be of a uniform size, which may not be the optimum mode of practice for the present invention.

The present invention increases the emission of both red and green light, however the blue component is not amplified. This brings about the possibility that the displayed image would lack enough blue for an accurate and pleasing reproduction. An additional embodiment of the present invention as disclosed in FIG. 3, includes increasing the relative area of the blue subpixel to compensate for the lack of intensity. Either increasing the size of the third blue subpixel 113 or forming two or more blue subpixels within the pixel element 10 accomplishes this. This increase in area might also be considered for the second green subpixel 112, as shown in FIG. 4, since the second green subpixel 112 is only amplified by converting the blue output of the OLED 120 to green, whereas the first red subpixel 111 is augmented by both the blue and green output of the OLED 120. As shown in FIG. 5, a further embodiment would be having both the green and blue subpixels of greater size than the red subpixels for the reasons just stated.

Another reason for increasing the green component output of the second green subpixel 112 is that the human visual system is most sensitive to this part of the visible spectrum, which accounts for most of the contrast information of the sensed image.

Figure 2:
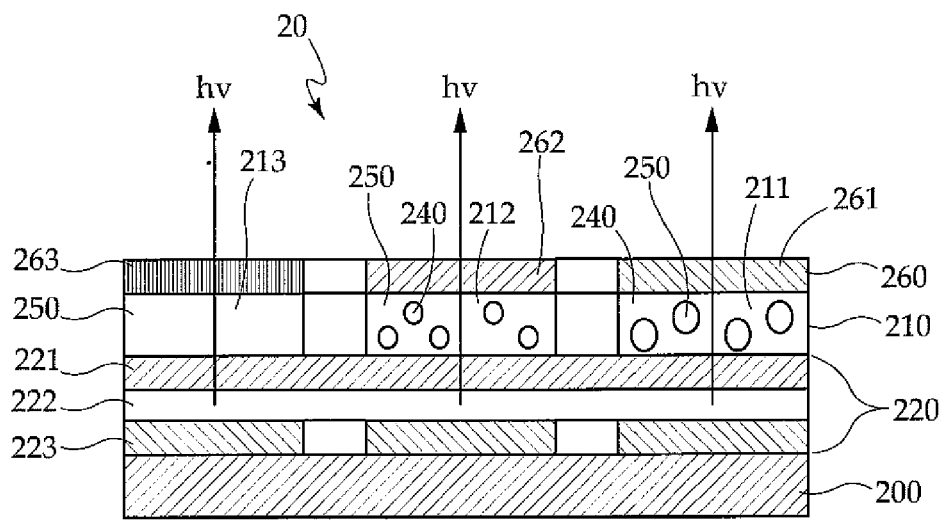
FIG. 2 is a schematic diagram of an alternate embodiment single pixel element for an up-emitting color organic light-emitting diode display device of the present invention.

FIG. 2 illustrates an alternate embodiment of the present invention, wherein an up-emitting color OLED video display device is shown as a single pixel element 20. In this alternate embodiment, single pixel element 20 comprises an opaque substrate 200 onto which the organic light-emitting elements or OLED stack 220 are patterned. The OLED stack 220 comprises reflecting electrode 223, at least one organic layer 222 and semitransparent electrode 221. Since light exits in the upward direction in this embodiment, color conversion matrix element 210 is patterned, or formed simultaneously, on top of the semitransparent electrode 221. Further, the color filter element 260 is patterned, or formed simultaneously, on top of the color conversion matrix element 210.

As embodied herein, the color conversion matrix element 210 comprises a two-dimensional array of at least three subpixels for color conversion, including a first subpixel 211, a second subpixel 212, and a third subpixel 213. The first subpixel 211 emits red light from both the original red output of the OLED 220 and also from the blue and green light emitted from the OLED 220 that the first subpixel 211 converts to red light. The first color filter element 261 is preferably red and is only necessary if tuning of the spectral properties of the red emission of first subpixel 211 is desired. Likewise, second subpixel 212 emits green light both from the original green light produced by the OLED 220 and blue light produced from the OLED 220 that the second subpixel 212 converts to green. The second color filter element 262 is preferably green and is necessary to filter out any red light from the OLED 220 output since that component cannot be converted to higher energy green light by the second subpixel 212 or green color conversion element. In this manner, the red and green emissions from the pixel element 20 are increased from what they would have been by simply filtering the white light output of the OLED 220.

The third subpixel 213 emits only the blue light produced by the OLED 220 directly and the third color filter element 263 is preferably blue and necessary to remove the green and red components of the OLED 220 emission.

In this alternate embodiment, the first and second color conversion subpixels 211 and 212 respectively, may be composed of semiconductor nanocrystals 240 uniformly dispersed in a suitable organic binding material 250. Preferably, nanocrystals 240 may be formed from "Cdx," where "Cd" is cadmium, and "x" may be chosen from sulfur, selenium, or tellurium.

Preferably, the organic binding material 250 may be polycarbonate, polyacrylate, or another like polymer, oligomer, monomer, or a mixture of these. Each pixel element 20 of the integrated display device comprises at least one color converting semiconducting nanocrystals sub-element 240 within the one first red subpixel 211 and the one second green subpixel 212, capable of absorbing shorter wavelengths and converting them into red and green light, respectively. The third blue subpixel 213 within each pixel element 20 contains pure organic binder material 250 and no nanocrystals, since blue light is the highest energy component of the white OLEO 220 emission.

As shown in FIG. 2, the pixel element 20 contains one of each of the primary colors, red, green and blue. Also, each subpixel is indicated to be of a uniform size, which may not be the optimum mode of practice for the present invention.

The present invention increases the emission of both red and green light, however the blue component is not amplified. This brings about the possibility that the displayed image would lack enough blue for an accurate and pleasing reproduction. An additional embodiment of the present invention includes increasing the relative area of the blue subpixel to compensate for the lack of intensity. Either increasing the size of the third blue subpixel 213 or forming two or more blue subpixels within the pixel element 20 accomplishes this. This increase in area might also be considered for the second green subpixel 212, since the second green subpixel 212 is only amplified by converting the blue output of the OLED 220 to green, whereas the first red subpixel 211 is augmented by both the blue and green output of the OLED 220. As shown in FIG. 5, a further embodiment would be having both the green and blue subpixels of greater size than the red subpixels for the reasons just stated.

Another reason for increasing the green component output of the second green subpixel 212 is that the human visual system is most sensitive to this part of the visible spectrum, which accounts for most of the contrast information of the sensed image.

In conclusion, herein is presented an improved color display device that increases the efficiency of use of white light emitted from the diode. The invention is illustrated by example in the drawing figures, and throughout the written description. It should be understood that numerous variations are possible, while adhering to the inventive concept. Such variations are contemplated as being a part of the present invention.

While only a limited number of preferred embodiments of the present invention have been disclosed for purposes of illustration, it is obvious that many modifications and variations could be made thereto. It is intended to cover all of those modifications and variations, which fall within the scope of the present invention as defined by the following claims.

We claim:

1. A color organic light-emitting diode (OLED) display, comprising a plurality of pixel elements, each comprising an OLED, a color filter layer, and a means for converting white light emitted from said OLED to color, wherein said color conversion means comprises an array of subpixels arranged adjacent to said color filter layer.

2. The display of claim 1, wherein said color conversion means is sandwiched between said OLED and said color filter layer.

3. The display of claim 2, wherein said OLED emits white light downwardly, and includes a plurality of pix elements further comprising:
   a flat transparent substrate;
   a color filter layer arranged on said flat transparent substrate and having color filter elements disposed therein;
   a color conversion matrix arranged on said color filter layer and including a plurality of subpixels disposed therein; and
   a two-dimensional matrix layer of organic light-emitting diodes arranged on said color conversion layer, wherein said matrix layer including a semitransparent electrode, at least one organic layer arranged on said semitransparent electrode and a reflecting electrode arranged on said at least one organic layer.

4. The display of claim 2, wherein said OLEO emits white light upwardly, and includes a plurality of pixel elements further comprising:
   a flat opaque substrate;
   a reflecting electrode arranged on said flat opaque substrate;
   a two-dimensional matrix layer of organic light-emitting diodes arranged on said reflecting electrode, wherein said matrix layer includes at least one organic layer arranged on said reflecting electrode and a semitransparent electrode arranged on said at least one organic layer;
   a color conversion matrix arranged on said two-dimensional matrix layer and including a plurality of subpixels disposed therein; and a color filter layer arranged on said color conversion matrix and having color filter elements disposed therein.

5. The display of claim 1, wherein said color filter layer comprises a plurality of color filter elements including at least one red, at least one green and at least one blue color filter element.

6. The display of claim 5, wherein said array of subpixels of said color conversion means includes at least one red subpixel aligned said red color filter element, at least one green subpixel aligned said green color filter element and at least one blue subpixel aligned said blue color filter element.

7. The display of claim 6, wherein said array of subpixels of said color conversion means are composed of semiconductor nanocrystals uniformly dispersed in an organic binding material.

8. The display of claim 7, wherein said nanocrystals are formed from cadmium and one element from the group consisting of sulfur, selenium or tellurium.

9. The display of claim 7, wherein said organic binding material is polycarbonate or polyacrylate.

10. The display of claim 7, wherein said organic binding material is from the group consisting of a polymer, oligomer, monomer, or a mixture of polymer, oligomer or monomer.

11. The display of claim 7, wherein said subpixels of said color conversion means include at least one red semiconductor nanocrystal within said red subpixel and at least one green semiconductor nanocrystal within said green subpixel.

12. The display device of claim 11, wherein each subpixel of said color conversion means is of uniform size.

13. The display device of claim 11, wherein said blue subpixel of said color conversion means is greater in size than said red and said green subpixel.

14. The display device of claim 11, wherein said green subpixel of said color conversion means is greater is size than said red and said blue subpixel.

15. The display device of claim 11, wherein said blue subpixel and said green subpixel of said color conversion means are greater in size than said red subpixel.

16. An organic light-emitting diode display for emitting light downwardly, including a plurality of pixel elements comprising:
   a flat transparent substrate;
   a color filter layer arranged on said flat transparent substrate and having color filter elements disposed therein;
   a color conversion matrix arranged on said color filter layer and including a plurality of subpixels disposed therein; and
   a two-dimensional matrix layer of organic light-emitting diodes arranged on said color conversion layer, wherein said matrix layer including a semitransparent electrode, at least one organic layer arranged on said semitransparent electrode and a reflecting electrode arranged on said at least one organic layer.

17. The display of claim 16, wherein said color filter elements include a first red, a second green and a third blue color filter element.

18. The display of claim 16, wherein said subpixels of said color conversion matrix are composed of semiconductor nanocrystals uniformly dispersed in an organic binding material.

19. The display of claim 18, wherein said nano crystals are formed from cadmium and one element from the group consisting of sulfur, selenium or tellurium.

20. The display of claim 18, wherein said organic bind material is polycarbonate or polyacrylate.

21. The display of claim 18, wherein said organic binding material is from the group consisting of a polymer, oligomer, monomer, or a mixture of polymer, oligomer or monomer.

22. An organic light-emitting diode display for emitting light upwardly, including a plurality of pixel elements comprising:
   a flat opaque substrate;
   a reflecting electrode arranged on said flat opaque substrate;
   a two-dimensional matrix layer of organic light-emitting diodes arranged on said reflecting electrode, wherein said matrix layer including at least one organic layer arranged on said reflecting electrode and a semitransparent electrode arranged on said at least one organic layer;
   a color conversion matrix arranged on said two-dimensional matrix layer and including a plurality of subpixels disposed therein; and
   a color filter layer arranged on said color conversion matrix and having color filter elements disposed therein.

23. The display of claim 22, wherein said color filter elements include a first red, a second green and a third blue color filter element.

24. The display of claim 23, wherein said organic binding material is polycarbonate or polyacrylate.

25. The display of claim 22, wherein said subpixels of said color conversion matrix are composed of semiconductor nanocrystals uniformly dispersed in an organic binding material.

26. The display of claim 25, wherein said nanocrystals are formed from cadmium and one element from the group consisting of sulfur, selenium or tellurium.

27. The display of claim 25, wherein said organic binding material is from the group consisting of a polymer, oligomer, monomer, or a mixture of polymer, oligomer or monomer.

28. A color OLED display including a pixel comprising an OLED, a color filter layer, and a color conversion matrix sandwiched between said OLED and said color filter layer for converting white light emitted from said OLED to color.

* * * * *